US008431190B2

(12) United States Patent
Maury et al.

(10) Patent No.: US 8,431,190 B2
(45) Date of Patent: Apr. 30, 2013

(54) METHOD FOR DEPOSITING HARD METALLIC COATINGS

(75) Inventors: Francis Maury, Labège (FR); Aurélia Douard, Béthune (FR)

(73) Assignee: Institut National Polytechnique de Toulouse (I.N.P.T.), Toulouse (FR)

( * ) Notice: Subject to any disclaimer, the term of this patent is extended or adjusted under 35 U.S.C. 154(b) by 628 days.

(21) Appl. No.: 12/374,109

(22) PCT Filed: Jul. 19, 2007

(86) PCT No.: PCT/EP2007/057459
§ 371 (c)(1),
(2), (4) Date: May 20, 2009

(87) PCT Pub. No.: WO2008/009714
PCT Pub. Date: Jan. 24, 2008

(65) Prior Publication Data
US 2009/0324822 A1    Dec. 31, 2009

(30) Foreign Application Priority Data

Jul. 21, 2006   (FR) ..................................... 06 06656

(51) Int. Cl.
*C23C 16/00* (2006.01)
*C23C 14/26* (2006.01)
*H05B 6/02* (2006.01)
*H05B 6/24* (2006.01)

(52) U.S. Cl.
USPC ...................................................... 427/252

(58) Field of Classification Search ............... 427/248.1, 427/587, 252
See application file for complete search history.

(56) References Cited

U.S. PATENT DOCUMENTS 5,900,279 A *   5/1999   Hideaki et al. ............. 427/248.1

FOREIGN PATENT DOCUMENTS

| WO | 00/04206 | 1/2000 |
| WO | 2005/026401 | 3/2005 |

OTHER PUBLICATIONS

Maury et al. Low temperature metallorganic CVD routes to chromium metal thin films using bis(benzene) chromium. J. Electrochem Soc. V. 146 No. 10 (Oct. 1999) pp. 3716-3723.*
Maury, Francis. Trends in Precursor Selection for MOCVD, Chem. Vap. Deposition, 1996 (month unavailable), 2, No. 3 pp. 113-116.*

(Continued)

*Primary Examiner* — Kelly M Gambetta
(74) *Attorney, Agent, or Firm* — Young & Thompson

(57) ABSTRACT

A method for depositing a hard metallic chrome coating or similar metal by chemical vapor deposition on a metallic substrate, includes: a) preparing a solution containing, in an oxygen-free solvent, i) a molecular compound of the bis (arene) family that's a precursor of the deposited metal with a decomposition temperature 300° C.-550° C., and ii) a chlorinated additive; b) introducing the solution as aerosol into a heated evaporator at a temperature between the solvent boiling temperature and the precursor decomposition temperature (PDT); and c) driving the vaporized aerosol from the evaporator towards a CVD reactor including a susceptor carrying the substrate, heated above the PDT, up to 550° C., the evaporator and CVD reactor being subjected to atmospheric pressure. This DLI-CVD method performed at low temperature and atmospheric pressure enables continuous industrial treatment of large metallic plates, producing hard, monolayer or nanostructured multilayer metallic coatings. An appropriate injectable solution is also described.

16 Claims, 2 Drawing Sheets

OTHER PUBLICATIONS

F. Maury et al., "Low temperature metallorganic chemical vapor deposition routes to chromium metal thin films using bis(benzene)chromium", Journal of the Electrochemical Society, 1999, pp. 3716-3724, vol. 146, No. 10, Electrochemical Society, Pennington, NJ, USA.

A. Douard et al., "Nanocrystalline chromium-based coatings deposited by DLI-MOCVD under atmospheric pressure from Cr(CO)6", Surface Coatings & Technology, 2006, pp. 6267-6271, vol. 200, Elsevier B.V.

* cited by examiner

METHOD FOR DEPOSITING HARD METALLIC COATINGS

FIELD OF THE INVENTION

This invention relates to the field of surface treatments by application of hard metal coatings for purposes of decoration and/or protection against wear, corrosion, or oxidation.

It has as its object a process for dry deposition of metal coatings, in particular based on chromium, making it possible to obtain monolayer coatings or stacks of nanostructured layers under atmospheric pressure. It also has as its object a solution that comprises a precursor of the metal that is to be deposited.

BACKGROUND OF THE INVENTION

The chromium coatings are extensively used for decorative applications or for the protection of parts against wear and corrosion. Hard chromium seems irreplaceable as a metallurgic coating in the field of surface treatments, taking into account its physico-chemical characteristics: good wear resistance due to a low friction coefficient, high chemical strength, hardness, and advantageous aesthetic finish. The coatings for the two above-mentioned applications differ only by their thickness (small for decorative finishes, large for protection). Chromium plating thus is called for as a treatment of choice in numerous industrial sectors (automobile, furniture, medical instruments, and optics).

The metal coatings based on chromium or other metals are essentially obtained by the electroplating bath method that makes possible the treatment in a stream of small parts like flat production of larger dimensions. Chromium plating is a process that is simple and easy to use, having low operating costs and making it possible to treat parts at a very low temperature (less than 100° C.). However, the thus obtained chromium coatings are often amorphous, having low hardness values. Annealing at 500° C. is then necessary to reach hardness values on the order of 1000 HV, whereby this value tends to drop at a higher temperature (300 HV at 700° C.). Furthermore, the films are tension-constrained, which may bring about poor adhesion with the necessity for an intermediate layer (Ni). Finally, the films that are obtained are microcracked, which weakens them with regard to corrosion, in particular if the coating protects a part that is sensitive to localized corrosion, made of stainless steel, for example. In addition, this wet surface treatment requires the use of chromium solution baths that are most often hexavalent, or sometimes trivalent, although the quality of the films that are obtained is generally not as good. Whereby the hexavalent chromium is known for its carcinogenic effects, the manufacturers that use these bath chromium-plating processes are working toward the constraining objective of "zero wastage." Incidentally, European environmental standards will prohibit its use starting in 2007.

Alternative, so-called suitable, techniques for dry deposition have been proposed to obtain chromium coatings with properties that are similar to those of electrolytic hard chromium, among which are found the chemical deposition techniques. For example, the chemical vapor-phase deposition (CVD, for Chemical Vapor Deposition) of a metal from a cement that consists of a metal powder in contact with a high-temperature volatile reducing compound is known. Regarding the chromium-based depositions, the metal powder is confined in the presence of a halide ($NH_4F$ or HF) and brought to high temperature (950-1050° C.). By chemical displacement reaction, a volatile chromium halide forms and is reduced in the presence of the formed dihydrogen. This process can operate at atmospheric pressure, but the depositions are obtained only at high temperature because of the halide-type metal source that is used. The so-called conventional CVD processes, directly using corresponding halide vapors as a chromium source, operate under dynamic vacuum and at high temperature.

These two CVD processes, strongly activated thermally, make possible the treatment of complex surfaces, but their primary drawbacks are (i) the use of halide precursors that are thermally robust, toxic, corrosive, and with limited volatility, and (ii) with high deposition temperatures that, on metal substrates, in particular steel or technical alloys that have specific properties, will cause dimensional deformations, microstructure modifications, changes in crystalline structure, leading to the degradation, and even the loss, of the specific functional properties of the treated part.

To bring the deposition temperatures to a value that is less than 550° C., considered to be the critical holding temperature of steels and alloys, organometallic molecular precursors have been used in the laboratory (MOCVD process, for Metal Organic CVD). Taking into account the low volatility and the thermal instability of these organometallic precursors that often come in powder form, it is necessary to operate under reduced pressure. In addition, the extended heating of the precursor in the sublimation zone, even at low temperature, can degrade the reagent before it arrives in vapor form at the deposition zone, thus involving problems of reproducibility in terms of flow rate, the initial reactive gas composition, and therefore the deposit quality.

The precursors that are used are preferably selected from among sandwich compounds in which the metal atom of degree of oxidation zero is linked to two aromatic cycles that are optionally substituted by alkyl groups. Obtaining a metal deposit then comes up against the fact that during the decomposition of the precursor that proceeds from the separation of the metal-ligand bonds, the hydrocarbon ligands also undergo decomposition and add their carbons, which causes the formation of ceramics such as chromium carbide and not metallic chromium. To eliminate this drawback, a chlorinated or thionic additive is introduced into the reactor: the additive in powder form is introduced in vapor state via a suitable peripheral line, by entrainment in a gas stream, like the precursor. It poisons the reactive surface and prevents the total decomposition of the ligands. The low volatility of the powders that are used as additives is an additional reason to operate under reduced pressure. The introduction of two reagents in powder form by independent lines, in addition to making the system complex and the increased investment cost that it involves, also poses different problems of adjustments, stability of the reactive gas mixture, and therefore reproducibility.

Physical vapor-phase deposition (PVD) processes have also been proposed as alternatives to wet processes. Metal chromium deposits have been made from chromium targets. In addition, solid chromium solutions are made by implanting nitrogen or carbon, having hardness values that can range up to 25 GPa, compared to pure chromium that is obtained without ionic implantation (6 GPa). However, the forced vacuum that is necessary to these processes, the high cost of equipment, and the low deposition rates constitute serious limitations to an implementation for a continuous surface treatment.

It thus appears that it has not been possible until now to make deposits of hard metal coatings at low temperature and under atmospheric pressure, applicable for the protective or decorative treatment of metal parts, in particular the parts with a large surface area, without recourse to bath treatments whose drawbacks have been mentioned above. This invention has as its object to meet this requirement. It has as its object a process that combines the technique of the chemical vapor-phase deposition and the direction liquid injection, the so-called DLI-CVD, a process according to which a solution that comprises an organometallic precursor of the metal compound to be deposited and a chlorinated additive is introduced into a reactor.

The principle of the DLI-CVD technique is to introduce into a chemical vapor-phase deposition chamber a solution of a precursor of the element to be deposited by periodic injection of droplets of said solution that are entrained by a vector gas to the deposition chamber. A DLI-CVD device has been developed for the deposition of thin layers of oxides on the microelectronics plates, but it has never been used for the deposition of non-noble metals at atmospheric pressure. This is due to the fact that work at atmospheric pressure, which offers a large advantage for the industrial production at low cost for large parts, imposes particular conditions that have not been defined to date. Furthermore, the operating conditions are not easily transposable to the deposition of metal layers. Actually, the works relative to obtaining metal layers by DLI-CVD involve only noble metals (Ru, Ag, . . . ), i.e., metals that have little or no affinity for the light elements C, O and N that are present in the commonly used solvents. In addition, in the case of microelectronic layers, carbon contamination is to be avoided. However, whereby the latter results from the large quantity of hydrocarbon solvent in the reactor, it is more easily controlled when the decomposition is conducted in the presence of oxygen or an oxidizing gas ($N_2O$, $H_2O$, . . . ). For coatings that are designed for microelectronics, oxidized solvents are often used, moreover. A large part of the carbon is then eliminated by combustion whereas an oxide film is deposited, which is not compatible with the purpose of this invention.

SUMMARY OF THE INVENTION

This invention eliminates these drawbacks by a process that can be implemented at temperatures that are less than 550° C. and at atmospheric pressure to deposit layers of hard metal chromium or of various other related metals, on steel or alloy substrates, from a unique solution. The process according to the invention thus makes it possible to consider the deposition in a stream of decorative and/or protective metal layers on large metal parts under industrial conditions.

More specifically, this invention has as its object a process for deposition of a hard coating of metal chromium or of another metal whose chemical properties are similar to those of chromium, by chemical vapor-phase deposition on a metal substrate, which process essentially comprises the steps that consist in:

a) Taking a solution that contains, in oxygen-free solvent, i) a molecular compound of the bis(arene) family, precursor of the metal to be deposited, whose decomposition temperature is between 300° C. and 550° C., and ii) a chlorinated additive, b) Introducing said solution in aerosol form into an evaporator that is heated to a temperature of between the boiling point of the solvent and the decomposition temperature of the precursor, c) Entraining the aerosol that is evaporated by a neutral gas stream from the evaporator to a CVD reactor comprising a susceptor that supports the substrate to be coated, heated to a temperature that is higher than the decomposition temperature of the precursor and at most 550° C., whereby the evaporator and the CVD reactor are subjected to atmospheric pressure.

DETAILED DESCRIPTION OF THE INVENTION

Figure 1:
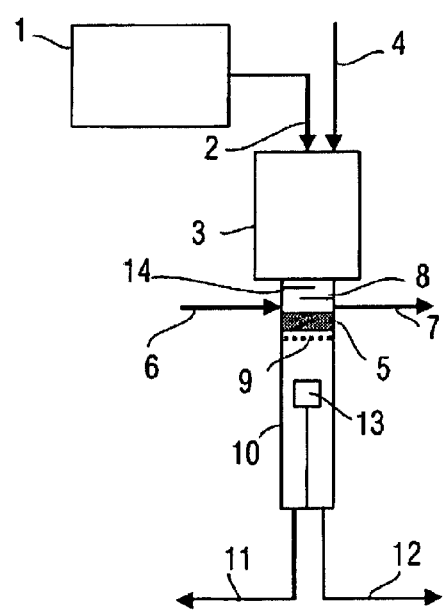
FIG. 1 depicts the DLI-MOCVD deposition device used for the deposition of metal layers.

The aerosol is formed according to the direct liquid injection technique by introduction in the pulsed mode of the solution of molecular precursor and chlorinated additive, fractionated into microdroplets. The aerosol is evaporated in an evaporator that is heated at least to the boiling point of the selected solvent and considerably lower than the decomposition temperature of the precursor, the chlorinated additive, and the solvent that are used. A gas stream that enters the nose of the injector brings the vapors of the precursor and the solvent from the evaporator to the deposition zone that consists of a susceptor that is heated by induction and that supports the substrate to be coated.

According to an advantageous characteristic of the process according to the invention, the evaporator is heated, at a temperature that is less than at least 50° C. and preferably at least 100° C., to the decomposition temperature of the precursor compound and the chlorinated additive. Thus, the aerosol is flash-evaporated, and any premature deposition on the walls of the evaporator is avoided.

The injection parameters of the precursor solution are preferably set using a computer program. They are adjusted so as to obtain a mist of fine and numerous droplets, a condition that is essential to the flash evaporation under atmospheric pressure, using a short opening time of the injector and a high injection frequency. The fractionation into microdroplets of the solution can be carried out by means of, for example, a modified diesel automobile injector, regulated with a short opening time and a high injection frequency. According to an advantageous characteristic of the process according to the invention, the aerosol is obtained by injection in pulsed mode with an opening time of less than 1 ms and a frequency of more than 4 Hz. The liquid injection thus constitutes a high-flow source of precursor solution, allowing a good yield of deposition of the coating.

The good performance of the process according to the invention, in particular its good hydrodynamic quality, requires high gas flow rates. The flow rate of neutral gas is advantageously between 4 cm/s and 10 cm/s. Thus, for a reactor of 50 mm in diameter, for example, the gas flow rate is regulated to more than 5,000 $cm^3$/mn. In the configuration where the evaporator is located coaxially above the CVD reactor, the flow benefits in addition from the gravitational force.

The neutral gas that is used as vector gas is preferably to be preheated, at a minimum to the temperature of the evaporator, to obtain an effective evaporation that is difficult to carry out under atmospheric pressure, which explains that the DLI-CVD techniques that are used to date all operate under reduced pressure. Thus, according to another characteristic of the process according to the invention, the neutral gas is heated to a temperature that is at least equal to that of the evaporator before penetrating therein.

The gas that is used is neutral in that it is not able to oxidize the reagents involved. The nitrogen will preferably be selected as vector gas for its low cost, but helium or argon, benefiting from a better thermal conductivity, can also be used even though they are more expensive. The neutral gas stream that enters the nose of the injector then entrains the precursor and solvent vapors from the evaporator to the deposition zone.

The metal element to be deposited is typically chromium, but it can also be any other metal whose chemistry and metallurgy are similar to those of chromium. Thus, according to a preferred characteristic of the process according to the invention, the metal element can be selected from among Cr, Nb, V, W, and Mo. This description that mentions chromium most often for the sake of simplicity is applied by wide-spread use to the other metals cited above.

According to an embodiment of the process according to the invention, the precursor of the metal element to be deposited is a compound that does not comprise an oxygen atom, selected from the family of metal bis(arenes) of general formula (Ar)(Ar')M, where M is the metal element of the degree of oxidation zero, and Ar, Ar' each represent an aromatic hydrocarbon cycle, such as benzene or benzene that is substituted by alkyl groups.

Whereby the stability of the ligand-metal bond increases with the number of substituents of the benzene core, a precursor that is selected from among the compounds in which Ar and Ar' represent two identical, sparingly substituted aromatic ligands will be preferred in a particular embodiment of the process according to the invention.

More preferably, the precursor can be selected from the bis(arene)chromium family, preferably from among bis(benzene)chromium or BBC, of formula $Cr(C_6H_6)_2$, bis(cumene) chromium of formula $Cr(C_6H_5iPr)_2$, bis(methylbenzene) chromium of formula $Cr(C_6H_5Me)_2$, and bis(ethylbenzene) chromium of formula $Cr(C_6H_5Et)_2$. Only the BBC comes in the form of a powder. The other precursors that are cited are liquid and could be directly injected without solvent. The BBC will preferably be selected for its commercial availability, the knowledge of its conventional vacuum MOCVD reactivity, and its relatively low decomposition temperature (350° C.).

According to another aspect of the invention, an additive whose function is to prevent the heterogeneous decomposition of the aromatic ligands of the precursor, which would lead to the formation of metal and non-metal carbide, is used. Used in the claimed process is a chlorinated additive that is selected from the family of halogenated cyclic hydrocarbons of formula $C_nH_{m-p}Cl_p$, in which $m \geq p$. The aromatic cycle can be entirely substituted by chlorine atoms (in this case m=p). Preferably, hexachlorobenzene is used as a chlorinated additive.

The solvent of the precursor compound plays an important role in the good implementation of the process according to the invention. Its selection should correspond to a set of chemical and physical criteria. First of all, the boiling point of the solvent should be less than the temperature of the evaporator to make possible a flash evaporation in the evaporator, typically heated to at least 150° C. The selected solvent should also have a low viscosity to facilitate the entrainment of the solution that can be injected by liquid means up to the evaporator. It should not contain oxygen to avoid the risk of oxidation of the deposits by cracking of the solvent that is used in the deposition zone. It should, of course, be inert chemically with regard to the precursor and the additive in solution and liquid under normal conditions.

In a convenient manner, the vapor tension will be low enough at atmospheric pressure to allow the storage of the injectable solution without evaporation of the solvent under normal conditions, so as to remove the risks of re-precipitation of the precursor if the initial concentration reached saturation, causing the clogging of the injectors. The light hydrocarbon solvents are therefore removed. Thus, according to the invention, the solvent is preferably selected from among the hydrocarbons of general formula $C_xH_y$, having a boiling point that is less than 150° C.

Unexpectedly, it was found that the presence of the solvent does not constitute an obstacle to the formation of a metal deposit. However, thermodynamic-simulation calculations at equilibrium have shown that at the deposition temperatures considered, the solvent was not inert, and by thermal cracking, it should bring about an incorporation of carbon that is superior to what is obtained without solvent. Surprisingly enough, we showed that the coatings developed under the same conditions by MOCVD (atmospheric pressure and 500° C.), with or without the presence of a cyclic solvent, had the same chemical compositions and the same crystallographic structures, namely the bcc centered cubic structure of the metal. This could be explained by the effect of the chlorinated additive preventing the heterogeneous decomposition of the cyclic structures—aromatic or aliphatic—that can be obtained both from the precursor and from the solvent. This is why, according to the invention, the solvent is advantageously a cyclic compound that meets the characteristics defined above, preferably selected from among toluene and cyclohexane.

Furthermore, according to an advantageous characteristic of the invention, the precursor compound and the solvent are selected such that the saturation concentration of the precursor compound in the solvent is greater than or equal to 0.01 mol/l so as to obtain an acceptable precursor flow rate that is much higher than with the conventional saturator sublimation method.

According to another preferred characteristic of the process according to the invention, the precursor compound and the chlorinated additive are in a molar ratio of at most 10%.

Finally, the combination of the BBC precursor and the hexachlorobenzene additive with toluene or cyclohexane as solvent will be preferred. Their structural proximity (aromatic and aliphatic cycles) and the low boiling point of these solvents relative to other aromatic solvents (mesitylene, xylene) is an advantageous characteristic of this process. In addition, the satisfactory BBC saturation concentration (0.05 mol/l) and its chemical integrity is retained when it is put into solution (the characteristic vibration bands of the BBC in solution in toluene or cyclohexane in the UV-Vis range are retained over time if the solution is kept under inert atmosphere). No reactivity is observed between $C_6Cl_6$ and BBC in solution in toluene or cyclohexane.

The chromium deposits that are obtained are carbon-supersaturated solid solutions. Properties of hardness and very advantageous friction behavior are combined with this particular structure. The carbon supersaturation on the order of 12 at % (against several percent of conventional MOCVD) is the signature of the DLI-MOCVD process.

A process for obtaining multilayer coatings that consist of a stack of layers deposited successively, as described above, whose individual thickness can be several nanometers to one hundred nanometers, is also the object of this invention. The nanostructuring of these multilayer metallurgic coatings imparts to them remarkable properties (protection, resistance to wear, hardness, . . . ), which can be adjusted by monitoring the period and by modifying the nature of the constituent layers. Thus, according to an advantageous embodiment of the process according to the invention, steps a) to c) are repeated several times to obtain a nanostructured multilayer coating.

The multilayer stack can consist of layers as described above, with a metal element that is different for each, using the alternating injection of two solutions of precursors based on different metal elements. The duration of the deposition can also be modulated. It is possible, for example, to obtain multilayer coatings that combine a carbon-supersaturated chromium solution with a solid solution based on Nb or V. Thus, according to an advantageous characteristic of the process according to the invention, it is possible, for each layer, to repeat the deposition steps a) to c) by varying at least one of the following parameters:

the nature of the metal borne by the precursor compound,
the duration of the repetition.

According to another particularly advantageous characteristic of this invention, it is possible to carry out the deposition of metal layers, as just described, alternating with the deposition of layers of other materials such as non-oxide ceramics, so as to form metal/ceramic architectured coatings. These ceramics are carbides, nitrides and carbonitrides of metal, which can be deposited with the same equipment by DLI-MOCVD, according to a process that is developed in the laboratories of the applicants and described in detail in a patent application in their name, whose teachings are incorporated in these proceedings. The stack consists of layers of individual thickness that can be several nanometers to about 100 nanometers. The nanostructuring of these multilayer metallurgic coatings imparts to them remarkable adjustable properties by monitoring the period and by varying the nature of the constituent layers (protection, wear resistance, hardness).

Thus claimed is a process for obtaining a hard coating of metal chromium or another metal of similar chemical properties by chemical vapor-phase deposition on a metal substrate, in which deposition steps a) to c) are repeated several times, alternating with the deposition of a non-oxide ceramic-type material, to obtain a nanostructured composite multilayer coating.

Another object of this invention is an injectable solution that is very particularly suited to the implementation of the process as just described. More specifically, an injectable solution in a chemical vapor-phase deposition device is claimed for obtaining a hard coating of chromium or another metal whose chemical properties are similar to those of the chromium, which solution, in a solvent that is selected from among the liquid hydrocarbons of general formula $C_xH_y$ that has a boiling point that is less than 150° C., contains:

i) a precursor molecular compound of the metal to be deposited whose decomposition temperature is between 300° C. and 550° C., selected from the family of metal bis(arenes) of general formula $(Ar/(Ar')M$, where M is the metal element of degree of oxidation zero and Ar, Ar' each represent an aromatic hydrocarbon cycle such as benzene or benzene substituted by the alkyl groups, and
ii) a chlorinated additive that is selected from the family of halogenated cyclic hydrocarbons of formula $C_nC_{m-p}Cl_p$, in which m≧p.

The precursor is selected based on the nature of the layer that it is desired to deposit. Preferably, in the injectable solution according to the invention, the metal is selected from among Cr, Nb, V, W, and Mo.

Particularly preferably, a precursor is selected from the chromium that is combined with aromatic ligands. For example, the injectable solution according to the invention comprises a precursor that is selected from the family of bis(arene)chromium, preferably from among the following compounds: bis(benzene)chromium, bis(cumene)chromium, bis(methylbenzene)chromium, and bis(ethylbenzene)chromium.

According to another characteristic of the invention, in the injectable solution, the chlorinated additive is hexachlorobenzene.

According to still another characteristic of the injectable solution according to the invention, the solvent is a cyclic hydrocarbon that is preferably selected from among toluene or cyclohexane.

Furthermore, advantageously, in the injectable solution according to the invention, the precursor compound and the solvent are selected such that the saturation concentration of the precursor compound in the solvent is greater than or equal to 0.01M.

Also advantageously, the precursor compound and the chlorinated additive are in a molar ratio of at most 10%.

The process according to the invention as just described makes it possible to carry out the deposition, by a DLI-assisted MOCVD technique at low temperature and under atmospheric pressure, protective and/or decorative metal coatings based on chromium or another transition metal, in the form of a monolayer or multilayer. The process according to the invention is able to be implemented, with suitable adaptations, for the treatment of large plates in a stream.

It thus constitutes the final step of the production of metal parts, including large parts, designed to be used in the mechanical industry, which should be protected and/or decorated using a hard and colored layer, resistant to wear, corrosion and oxidation. It is possible to cite in particular the production of parts that require a surface treatment to improve their tribological characteristics, such as the gears or the engine parts, or else the cutting tools.

Thus claimed is a process for the production of a metal part that comprises a chemical vapor-phase deposition operation of at least one layer of a hard coating of metal chromium or a metal that has chemical properties that are similar to those of the chromium, whereby said chemical vapor-phase deposition is carried out by a deposition process as described above and advantageously with an injectable solution as described above.

The following examples will make it possible to better understand the advantages of the process according to the invention and to illustrate particular aspects thereof.

EXAMPLE 1

DLI-MOCVD Deposition Device

The DLI-MOCVD device that is used for the deposition of metal layers, which will be described in detail later, consists primarily of a vertical, cold-wall CVD reactor linked to a commercial pulsed injection system. It makes it possible to obtain monolayer metal coatings as well as nanostructured multilayer stacks of these same coatings.

In the configuration where it is shown in FIG. 1, it comprises in a central manner an evaporator 3 that empties into a deposition chamber 10 that consists of a vertical cold-wall CVD reactor. A pressurized storage tank 1 for the precursor solution at ambient temperature supplies an injector 2 whose opening toward the evaporator 3 is computer-monitored. A modified diesel automobile injector is conventionally used. A line for feeding vector gas 4 enters the nose of injector 2. A stop valve 5 makes it possible to insulate the evaporator 3 from the deposition chamber 10. The tap 6 above the stop valve 5 makes possible the intake of a reactive gas to obtain a metal/ceramic architectured coating. The tap 7 above the stop valve 5 makes possible the pumping of the evaporator 3 during the cycles for purging or cleaning the latter. The flange 14 on which the taps 6 and 7 are made as well as the stop valve 5 at the intake of the reactor 10 are heated to a temperature that is close to that of the evaporator 3, i.e., to at least 150° C. The gas stream that enters the nose of the injector 2 entrains the precursor and solvent vapors from the evaporator 3 to the deposition chamber 10, which comprises the susceptor 13 on which the substrate to be coated is placed. A baffle 8 makes it possible to stop the possible droplets that are not evaporated at the outlet of the evaporator 3, and a grid 9 that is pierced by holes uniformly distributes the gas stream, whereby the unit is connected to the deposition chamber 10. This grid 9 makes possible a good distribution of the gas stream at the intake of the deposition chamber 10, which contributes to obtaining a good surface condition of the coatings and a uniform thickness. The evaporator 3 is located co-axially above the CVD reactor 10. The whole unit is equipped with a primary pumping group 11 that makes it possible to purge the system before any implementation. A system 12 for recycling solvent vapors and by-products of the CVD reaction can be added.

This device makes it possible to obtain metal coatings of hard chromium as well as multilayer stacks of these same coatings at atmospheric pressure and at a low deposition temperature.

EXAMPLE 2

Obtaining Chromium Metal Coatings from a BBC and $C_6Cl_6$ Solution in Toluene

The Precursor Solutions

The bisarene-type organometallic chromium precursor: $Cr(C_6H_6)_2$ or BBC, dissolved in degassed toluene and dehydrated on silica gel, is used. The decomposition temperature of the BBC is 350° C. Whereby the saturation concentration of the BBC in toluene determined by UV-Vis spectrophotometry is $5.1 \cdot 10^{-2}$M, a solution with a lower concentration (here, equal to $3.10^{-2}$ mol/l) is prepared to avoid any re-precipitation of the precursor that would run the risk of plugging the injector of the DLI system.

The chlorinated additive is $C_6Cl_6$. Purification by recrystallization can be considered to avoid any contamination with oxygen. Four solutions are prepared with a different $C_6Cl_6$/BBC molar ratio (see table on the following page).

The solution, pressurized at 2.5 bar (relative), is injected at a rate of 1.4 ml/minute at a frequency of 10 Hz and an opening time of 0.5 ms in the evaporator that is heated to 200° C., previously purged with nitrogen and under atmospheric pressure.

| [BBC] in mol/l | [C6Cl6] in mol/l | r = $C_6Cl_6$/BBC |
|---|---|---|
| $3 \cdot 10^{-2}$ | $3 \cdot 10^{-3}$ | 0.1 |
| $3 \cdot 10^{-2}$ | $7.5 \cdot 10^{-3}$ | 0.25 |
| $3 \cdot 10^{-2}$ | $1.5 \cdot 10^{-2}$ | 0.5 |
| $3 \cdot 10^{-2}$ | $3 \cdot 10^{-2}$ | 1.0 |

The Deposition

The substrates are SS304L steel pellets that have a 1 cm diameter and small Si(100) plates. They are placed on a susceptor made of passivated graphite of SiC or stainless steel. After a purging phase, they are heated by induction to 500° C. under a vector gas stream (here, nitrogen) of 4.2 cm/s (or 5,000 cm$^3$/mn for a reactor with a diameter of 50 mm), itself preheated to the temperature of the evaporator, or 200° C. The deposition temperature is monitored by a thermocouple that is housed inside the susceptor. The CVD reactor is under atmospheric pressure.

The deposition as indicated above is initiated until a layer with a thickness ranging from about ten nanometers to several microns according to the duration of the deposition is obtained. Under the indicated conditions, the rate of growth is between 0.3 µm/h and 0.5 µm/h. For the same deposition duration, the rate of growth can be multiplied by increasing the frequency of the injector and therefore the precursor flow rate, without modifying the other parameters (opening time of the injector and gas stream). A gray-metallic deposit with a mirror finish is obtained on the two substrates, with the four solutions.

Characterization of the Coatings

These coatings adhere to mirror-polish 304L stainless steel and to Si(100).

Figure 2:
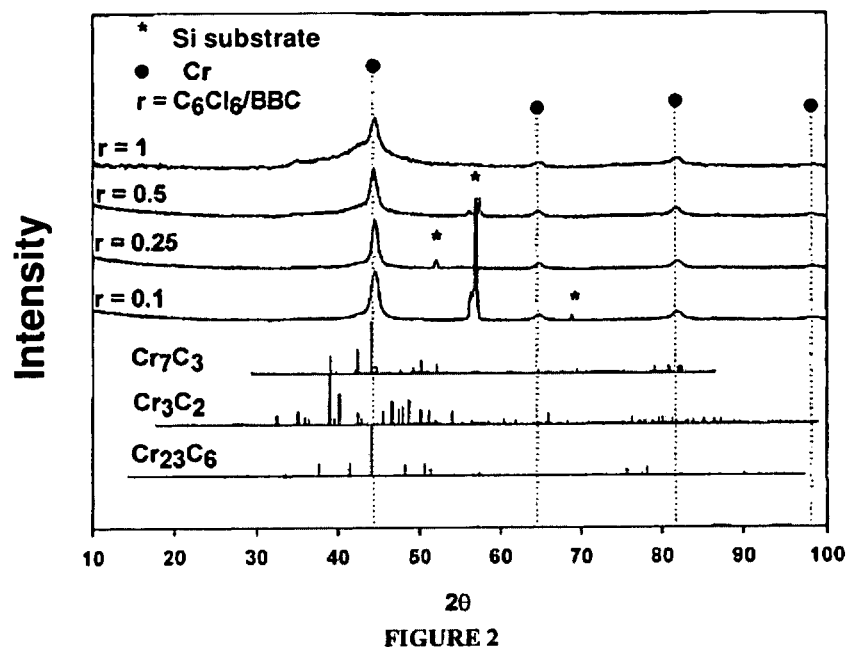
FIG. 2 depicts the diagrams of X-Ray diffraction analyses of the metal chromium coatings deposited on the substrate Si compared to those of the stable chromium carbides listed in the database of JCPDS.

Grazing-incidence X-ray diffraction analyses have been carried out. The diagrams of the metal chromium coatings deposited on the substrate Si compared to those of the stable chromium carbides listed in the database of JCPDS (Joint Committee for Powder Diffraction Studies, International Center for Diffraction Data, www.icdd.com), are presented in FIG. 2. They show a Cr crystallized structure, bcc centered cubic lattice whose position and intensity of the peaks are shown by black dots, without any evidence of the formation of chromium carbides.

Chemical analyses by electronic microprobe (Electron Probe Microanalysis EPMA) show a content of about 15% atomic carbon, quite superior to the solubility in the metal, whereby the typical composition is $Cr_{0.85}C_{0.15}$. The layers consist of a solid chromium solution that is unusually supersaturated with carbon (this colossal solubility of C in Cr is not provided by the thermodynamics). For higher $C_6Cl_6$/BBC ratios, the surface of the coating is contaminated with chlorine, and the deposit tends toward a more amorphous crystallographic structure that is less well-defined by X-ray diffraction.

The chromium coatings that are obtained on mirror-polish 304L stainless steel are homogeneous and particularly dense. They have noteworthy hardness values. The hardness that is obtained by nanoindentation is 17±2.5 GPa (or about 2 times more than that of the hard chromium that is developed by electrodeposition without annealing, which has the same bcc cubic structure) on a coating of 500 nm.

EXAMPLE 3

Obtaining Chromium Metal Coatings from a BBC and $C_6Cl_6$ Solution in Cyclohexane The composition of the injectable solution is as follows. The chromium precursor is BBC and the chlorinated additive is hexachlorobenzene $C_6Cl_6$. They are used in a molar ratio r=0.1 in solution in cyclohexane, at a rate of $1.4 \cdot 10^{-2}$ mol/l for the BBC and $1.4 \cdot 10^{-3}$ mol/l for $C_6Cl_6$. The deposition procedure that is applied here is the same as that of Example 2.

A dull gray deposit is obtained, whereas with the toluene solvent, for the same coating thicknesses, the chromium deposit is a gray-metallic mirror deposit. This is due to a nodular surface morphology, responsible for a high level of surface roughness. In section, the layer first consists of a dense-surface structure, then a nodular structure measuring several hundred nanometers.

Figure 3:
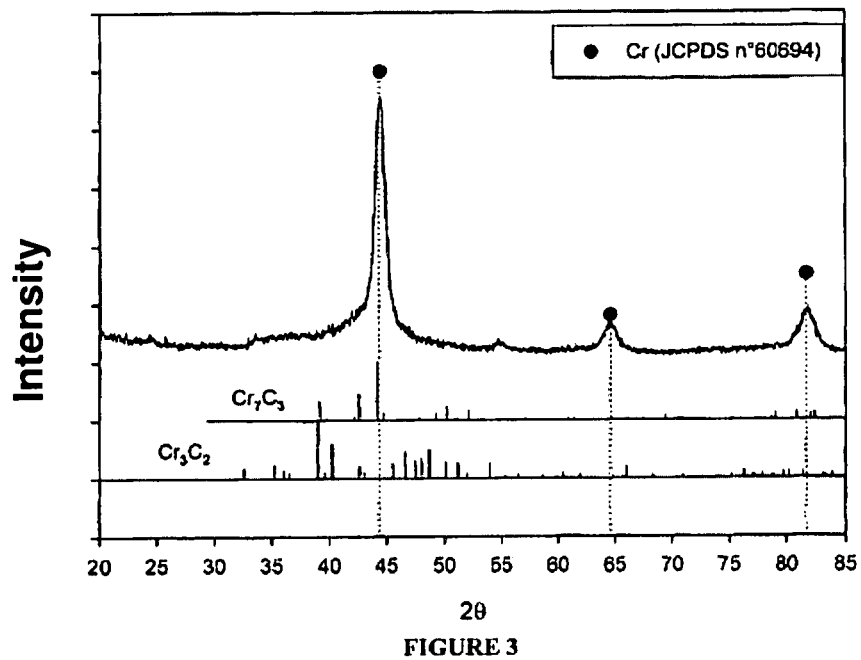
FIG. 3 depicts the diagrams of X-Ray diffraction analyses obtained for a deposition on Si, compared to the stable carbide diagrams listed in the JCPDS database.

X-Ray diffraction analyses have been carried out. FIG. 3 presents the diagram that is obtained for a deposition on Si, compared to the stable carbide diagrams listed in the JCPDS database already cited. They show a crystallized structure of bcc centered cubic lattice corresponding to the chromium whose peaks are referenced by the black dots. Castaing microprobe analyses (EPMA) reveal a $Cr_{0.85}C_{0.15}$-type chemical composition. These coatings adhere to mirror-polish 304L stainless steel and to Si.

The invention claimed is:

1. A process for deposition of a hard coating of metal chromium or of another metal whose chemical properties are similar to those of chromium, by direct liquid injection-chemical vapor-phase deposition on a metal substrate, comprising the steps of:
    a) Taking a solution that contains, in an oxygen-free solvent, i) a molecular compound of the bis(arene) family, precursor of the metal to be deposited, whose decomposition temperature is between 300° C. and 550° C., and ii) a chlorinated additive, the precursor compound and the solvent are selected such that the saturation concentration of the precursor compound in the solvent is greater than or equal to 0.01M, and the precursor compound and the chlorinated additive are in a molar ratio of at most 10%,
    b) Forming an aerosol of said solution by direct liquid injection, said solution being pressurized and injected in a pulsed mode, and introducing said solution in aerosol form into an evaporator, said evaporator being at atmospheric pressure and heated to a temperature of between the boiling point of the solvent and the decomposition temperature of the precursor,
    c) Entraining the aerosol that is evaporated by a neutral gas stream from the evaporator to a CVD reactor comprising a susceptor that supports the substrate to be coated, the CVD reactor being at atmospheric pressure and heated to a temperature that is higher than the decomposition temperature of the precursor and at most 550° C.,
    wherein chromium deposits formed on the substrate by steps a) to c) are carbon-supersaturated solid solutions.

2. The process according to claim 1, wherein the evaporator is heated at a temperature that is less than at least 50° C. to the decomposition temperature of the precursor compound and the chlorinated additive.

3. The process according to claim 1, wherein the aerosol is obtained by injection in pulsed mode with an opening time that is less than 1 ms and a frequency that is greater than 4 Hz.

4. The process according to claim 1, wherein the neutral gas is heated to a temperature that is at least equal to that of the evaporator before penetrating therein.

5. The process according to claim 1, wherein the flow rate of the neutral gas in the evaporator is between 4 cm/s and 10 cm/s.

6. The process according to claim 1, wherein the metal is selected from the group consisting of Cr, Nb, V, W, and Mo.

7. The process according to claim 1, wherein the precursor compound is a compound that does not comprise an oxygen atom, selected from the family of metal bis(arenes) of general formula (Ar)(Ar')M, where M is the metal element of the degree of oxidation zero, and Ar, Ar' each represent an aromatic hydrocarbon cycle such as benzene or benzene substituted by alkyl groups.

8. The process according to claim 7, wherein the precursor is selected from among the compounds in which Ar and Ar' represent two identical, sparingly substituted aromatic ligands.

9. The process according to claim 8, wherein the precursor is selected from the family of bis(arene)chromium selected from the group consisting of bis(benzene)chromium, bis(cumene)chromium, bis(methylbenzene)chromium and bis(ethylbenzene)chromium.

10. The process according to claim 1, wherein the chlorinated additive is selected from the family of halogenated cyclic hydrocarbons of formula $C_nH_{m-p}Cl_p$, in which $m \geq p$.

11. The process according to claim 10, wherein the chlorinated additive is hexachlorobenzene.

12. The process according to claim 1, wherein the solvent is selected under normal conditions from among the liquid hydrocarbons of general formula $C_xH_y$ that have a boiling point that is less than 150° C.

13. The process according to claim 12, wherein the solvent is a cyclic hydrocarbon.

14. The process according to claim 1, wherein the deposition steps a) to c) are repeated several times to obtain a nanostructured multilayer coating.

15. The process according to claim 14, wherein for each layer, deposition steps a) to c) are repeated by varying at least one of the following parameters:
    the nature of the metal borne by the precursor compound,
    the duration of the repetition.

16. The process according to claim 14, wherein the deposition steps a) to c) are repeated several times alternating with the deposition of a non-oxide ceramic-type material to obtain a nanostructured composite multilayer coating.

* * * * *

UNITED STATES PATENT AND TRADEMARK OFFICE
CERTIFICATE OF CORRECTION

PATENT NO. : 8,431,190 B2  Page 1 of 1
APPLICATION NO. : 12/374109
DATED : April 30, 2013
INVENTOR(S) : Maury et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 853 days.

Signed and Sealed this
Eighth Day of September, 2015

Michelle K. Lee
*Director of the United States Patent and Trademark Office*